(12) United States Patent
Reymann et al.

(10) Patent No.: US 8,378,845 B2
(45) Date of Patent: Feb. 19, 2013

(54) ENERGY CONSUMPTION MEASUREMENT

(75) Inventors: Steffen Reymann, Redhill (GB); Paul Richard Simons, Redhill (GB); David George Clark, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 496 days.

(21) Appl. No.: 12/668,463

(22) PCT Filed: Jun. 12, 2008

(86) PCT No.: PCT/IB2008/052216
§ 371 (c)(1),
(2), (4) Date: Jan. 11, 2010

(87) PCT Pub. No.: WO2009/010892
PCT Pub. Date: Jan. 22, 2009

(65) Prior Publication Data
US 2010/0188262 A1    Jul. 29, 2010

(30) Foreign Application Priority Data
Jul. 19, 2007  (EP) .................................. 07112775

(51) Int. Cl.
*G08B 23/00* (2006.01)
(52) U.S. Cl. ...................... 340/870.02; 700/295; 307/37
(58) Field of Classification Search ............ 340/870.02; 379/106.03; 455/404.1; 700/276, 295; 702/115, 702/62
See application file for complete search history.

(56) References Cited

U.S. PATENT DOCUMENTS

| | | | |
|---|---|---|---|
| 4,639,876 A | 1/1987 | Deeds | |
| 4,858,141 A | 8/1989 | Hart et al. | |
| 5,430,430 A | 7/1995 | Gilbert | |
| 5,572,438 A | 11/1996 | Ehlers et al. | |
| 6,906,617 B1 | 6/2005 | Van der Meulen | |
| 7,427,927 B2 * | 9/2008 | Borleske et al. | 340/870.02 |
| 7,480,501 B2 * | 1/2009 | Petite | 455/404.1 |
| 7,495,578 B2 * | 2/2009 | Borleske | 340/870.02 |
| 7,545,285 B2 * | 6/2009 | Shuey et al. | 340/870.02 |
| 7,548,826 B2 * | 6/2009 | Witter et al. | 702/115 |
| 7,555,364 B2 * | 6/2009 | Poth et al. | 700/276 |
| 7,561,681 B2 * | 7/2009 | Booth et al. | 379/106.03 |
| 7,765,035 B2 * | 7/2010 | Rodgers | 700/295 |
| 2002/0010690 A1 | 1/2002 | Howell et al. | |
| 2003/0063723 A1 * | 4/2003 | Booth et al. | 379/106.03 |
| 2004/0037221 A1 * | 2/2004 | Aisa | 370/229 |
| 2010/0305891 A1 * | 12/2010 | Rodgers | 702/62 |

FOREIGN PATENT DOCUMENTS

| | | |
|---|---|---|
| EP | 1403998 A2 | 3/2004 |
| FR | 2680875 A1 | 3/1993 |
| JP | 2004219181 A | 8/2004 |
| JP | 2004355531 A | 12/2004 |
| JP | 2005102428 A | 4/2005 |

* cited by examiner

*Primary Examiner* — Jean B Jeanglaude

(57) ABSTRACT

A system for measuring energy consumption including a plurality of devices of which at least a subset includes a communication unit for supplying operating status information indicating an actual operating status with respect to an actual energy consumption of the associated one of the plurality of devices. A meter measures a total energy consumption of the plurality of devices. A controller calculates an individual energy consumption of a particular one of the plurality of devices from a change of the total energy consumption occurring at a change of the operating status of the particular one of the plurality of devices.

14 Claims, 4 Drawing Sheets

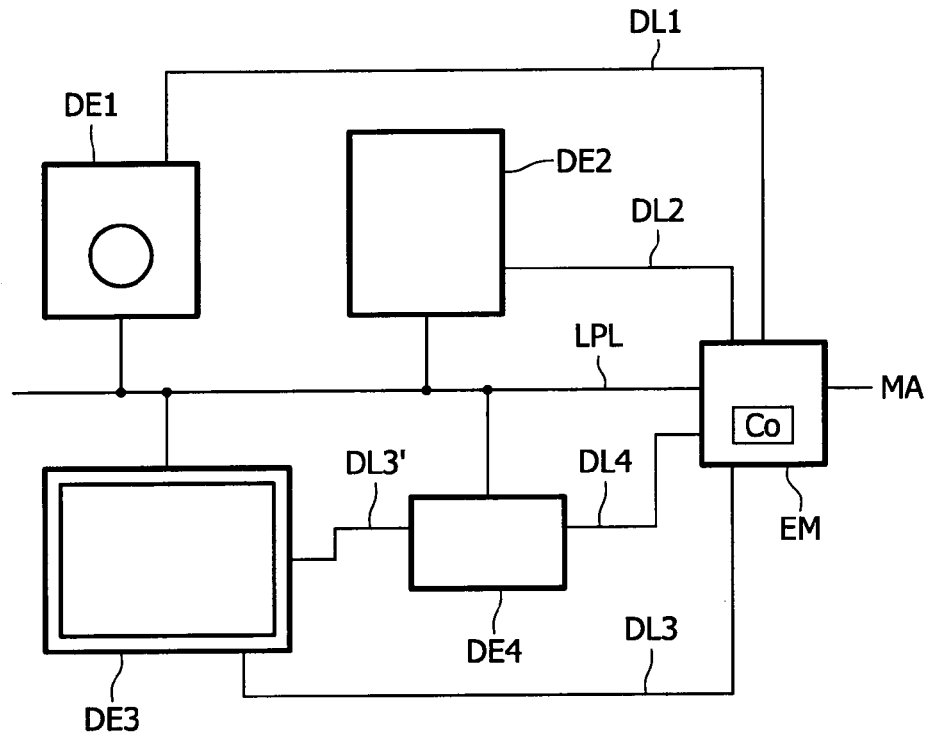
FIG. 5
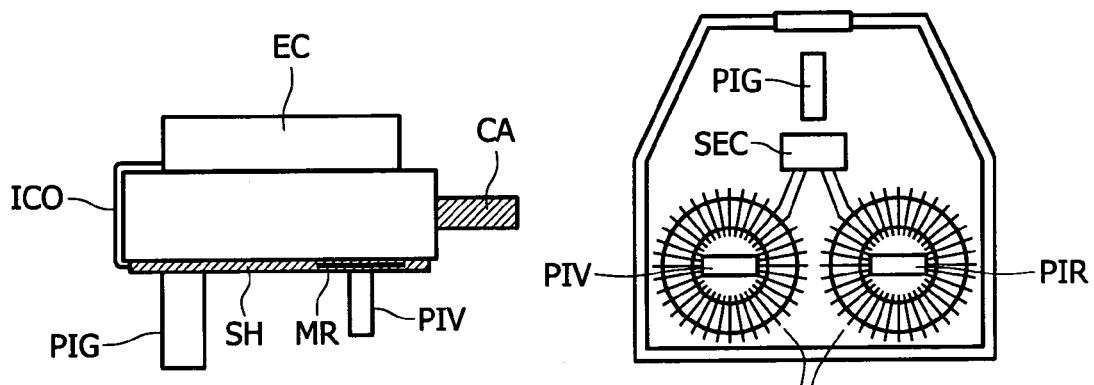
FIG. 6A
FIG. 6B

ENERGY CONSUMPTION MEASUREMENT

This application is a National Stage of International Application No. PCT/IB08/052216, filed Jun. 12, 2008, which claims the benefit of European Patent Application (EPO) No. 07112775.7, filed Jun. 19, 2007.

FIELD OF THE INVENTION

The invention relates to a system for measuring energy consumption, a controller for use in the system and a method of measuring energy consumption.

BACKGROUND OF THE INVENTION

Climate change and global warming are key issues. Consequently, a requirement exists to supervise energy consumption. Currently, in a standard household, electricity metering is done by a single meter which measures the sum of the energy consumption of all energy consuming devices in the household. The purpose of measuring the total energy consumption is to know how much to bill the consumer.

U.S. Pat. No. 5,572,438 discloses an energy management and building automation system including a local area network or home automation data bus. Each load (energy consuming device) is connected to the bus via a control module which may contain a circuit breaker to disconnect the load from the mains upon command or upon occurrence of a power outage. The control modules may be a current monitor control unit which measures load current, or a power monitor module which monitors the power consumed by the associated load. Both modules transmit bus messages indicating load status and status changes. The on/off status per load is determined by sampling the load current drawn by the load and comparing the sensed load current with a reference. If the current is below the reference, the load is considered to be switched off, if the current is above the reference, the load is considered to be switched on.

A first microcomputer is arranged preferably external to the premises and adjacent to the electric utility power meter. A second microcomputer preferably is inside the customer premises. The two microcomputers communicate with each other and with the various modules via the network/data bus. The first microcomputer communicates with the utility company via any appropriate communications link. The second microcomputer serves as in input/output terminal for the system, allowing the customer to set parameters and query the system as to power usage, displaying reports requested by the customer and messages transmitted by the utility company and by either microcomputer. The first microcomputer acts as a master controller and/or network server, communicating with the world outside the premises, as a communication gateway between voice, video and data services, and being the primary data collector and operator of load control modules. The utility company can access selected utilization data and control at least some loads via messages to the first microcomputer.

SUMMARY OF THE INVENTION

It is an object of the invention to simplify the power measuring system by deleting the power measurement per energy consuming device.

A first aspect of the invention provides a system for measuring energy consumption as claimed in claim 1. A second aspect of the invention provides a controller for use in the system as claimed in claim 14. A third aspect of the invention provides a method of measuring energy as claimed in claim 15. Advantageous embodiments are defined in the dependent claims.

A system for measuring energy consumption in accordance with the first aspect of the invention comprises a plurality of devices which consume energy. At least a subset of the devices comprises a communication unit which supplies operating status information indicating an actual operating status with respect to an actual energy consumption of the associated one of the plurality of devices. The operating status information may be a simple on/off status which indicates whether the device is switched on or off. Alternatively, more sophisticated information may be supplied which, for example, may indicate the actual energy consumption or the actual average energy consumption in a predetermined time period. A meter measures a total energy consumption of the plurality of devices. For example, the meter may be an electricity meter or a fuel gas meter. A controller calculates an individual energy consumption of a particular one of the plurality of devices from a change of the total energy consumption occurring at a change of the operating status of the particular one of the plurality of devices. In an embodiment the energy is electricity.

It has to be noted that the system may comprise further energy consuming devices which do not have a provision to provide status information. The controller knows the actual total energy consumption of all devices and knows the delta energy consumption when a particular one of the devices of the subset is switched on or off. Consequently, the controller is able to determine the energy consumption for each one of the devices of the subset by using a single meter. It is not required to sense the power consumption per device.

In an embodiment, the communication unit supplies an identifier uniquely identifying the associated one of the plurality of devices. This has the advantage that the controller knows what actual apparatus is used, and thus is able to provide energy consumption information with reference to the specific apparatus.

In an embodiment, the controller is mechanically integrated with the electricity meter. This has the advantage that the meter information is directly available.

In an embodiment, the system further comprises a consumer apparatus which is one of the plurality of the devices. The controller is mechanically integrated with the consumer apparatus. For example, the consumer apparatus is a television, a computer monitor, or a set-top box.

In an embodiment, the consumer apparatus comprises a display for displaying information based on the individual energy consumption. Of course other energy consumption information than the individual energy consumption may be displayed such as the actual or an average total energy consumption. Instead of the energy consumption itself, other related information may be displayed such as the cost or an equivalent amount of $CO_2$. By integrating the controller in the consumer apparatus with a display or having access to a display, it is not required to add a separate display. Although, alternatively, the controller may communicate with a handheld apparatus which has a display.

In an embodiment, the system comprises a consumer apparatus, and the controller is an add-on to a power plug of the consumer apparatus. This makes it easy to add the controller to an existing configuration. Especially if the data transport between the controller and other parts of the system is performed via the mains power wires, this is an elegant solution.

In an embodiment, the communication unit wirelessly transmits the operating status, and the controller wirelessly receives the operating status. Besides the operating status, also the identifier may be wirelessly communicated.

In an embodiment, the communication unit transmits the operating status via the local mains power lines which interconnect the plurality of devices and the controller. Besides the operating status, also the identifier may be communicated via the mains.

In an embodiment, the controller has a communication unit for communicating with a central unit of an electricity supplier. This allows the electricity supplier to use the information on the power consumption of individual devices, for example, to provide more detailed feedback based on this information to the user making him or her more aware of his or her behavior with respect to energy consumption. For example, the bill may show the energy consumption of individual devices.

In an embodiment, the controller comprises a user interface which receives user input. The controller performs a setup phase wherein a user manually informs the controller about a change of the operating status of a device which does not having a unique identifier. In response to this input, the controller determines the individual energy consumption of this device from the change of total energy consumption occurring in response to the change of the operating status. This embodiment has the advantage that the controller gets input on devices which do not have an identifier, such that the switching on and off can be tracked by following the changes in the energy consumption detected by the meter.

These and other aspects of the invention are apparent from and will be elucidated with reference to the embodiments described hereinafter.

It should be noted that items which have the same reference numbers in different Figures, have the same structural features and the same functions, or are the same signals. Where the function and/or structure of such an item has been explained, there is no necessity for repeated explanation thereof in the detailed description.

DETAILED DESCRIPTION

Figure 1:
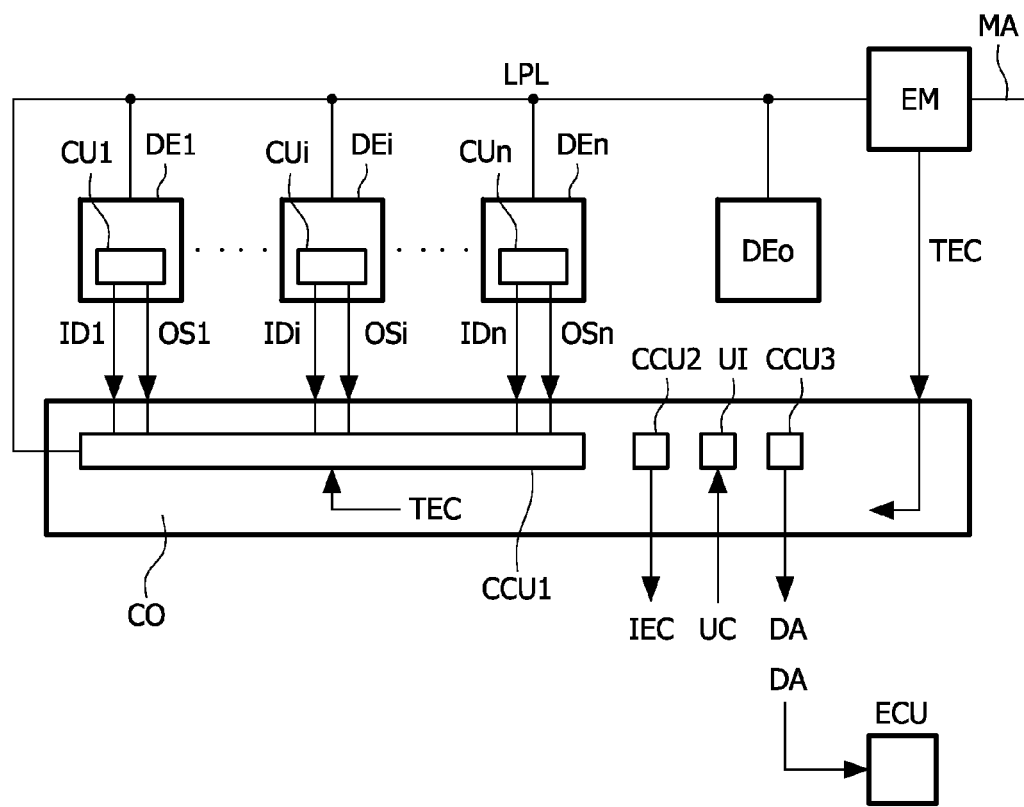
FIG. 1 schematically shows an embodiment of a system for measuring an energy consumption of a plurality of devices, FIG. 2 schematically shows a graph indicating an example of the total power measured, FIG. 3 schematically shows an embodiment of a consumer apparatus with a controller for determining the energy consumption of individual devices, FIG. 4 schematically shows an example of an add-on device with a controller for determining the energy consumption of individual devices, FIG. 5 schematically shows an embodiment of a system in which the controller is mechanically integrated with the meter, and FIG. 6 schematically show an AC mains plug with current sensing circuitry.

FIG. 1 schematically shows an embodiment of a system for measuring an energy consumption of a plurality of devices.

The system comprises a plurality of devices DE1, ..., DEi, ..., DEn which consume energy. It has to be noted that often a device which consumes energy is referred to as a device which consumes power. However, correctly speaking, power is energy per second. In the context of the present invention the term energy is used because it also covers power. Further, in the now following, if an item is referred to by one or more capital letters followed by a number, this number has to be considered to be an index. Thus DE1 or DEn refers to the particular device 1 or n. However, the index i is used to indicate the item in general, and thus DEi means any one of the devices DE1 to DEn, or the devices DE1 to DEn in general.

Each one of the devices DEi comprises a communication unit CUi (CU1, ..., CUi, ..., CUn) which provides operating status information OSi. The operating status information OSi may be a simple on/off information or signal. Alternatively, the operating status information OSi may be a more complex information providing an actual power consumption or an average power consumption. For example, the average power consumption may be averaged over a period in time which is synchronized which a sample rate at which the controller CO requests or gets information from the devices DEi. The information may be a (multi) level signal or be coded and/or modulated on a carrier. The communication units CUi further provide a unique identification code IDi which uniquely identifies the corresponding device DEi. Any devices DEi which do not have a unique identification code IDi are gathered in the block indicated by DE0.

The controller CO comprises the communication units CCU1, CCU2 and CCU3. The communication unit CCU1 communicates with the communication units CUi of the devices DEi to receive the operating status information OSi and the identification codes IDi. The communication unit CCU2 communicates with the energy meter EM to receive the total energy consumption TEC measured by the energy meter EM and determines the individual energy consumption IEC of the devices DEi. Alternatively, the communication unit CCU1 may receive the total energy consumption TEC and supply the individual energy consumption IEC. The optional communication unit CCU3 communicates with a central unit ECU of the energy supplier to send data DA to the central unit ECU. The controller CO may further comprise a user interface UI to receive user input UC.

Each one of the devices DEi is connected to the local power line LPL to receive power from the mains MA via the energy meter EM. Also the controller CO may be connected to the local power line LPL. As will become clear from further Figures, the controller CO may be combined with the meter EM or with one of the devices DEi. Dependent on the configuration, the communication units CCU2 or CCU3 may be superfluous. The operation of this system will be elucidated with respect to the graph shown in FIG. 2.

The data DA which is sent to or retrieved by the central unit ECU may comprise information on the energy consumption per device DEi such that the energy supplier is able to inform the client in detail about the energy consumption in his or her premises. For example, the bill sent may contain a per item energy consumption and/or cost.

Figure 2:
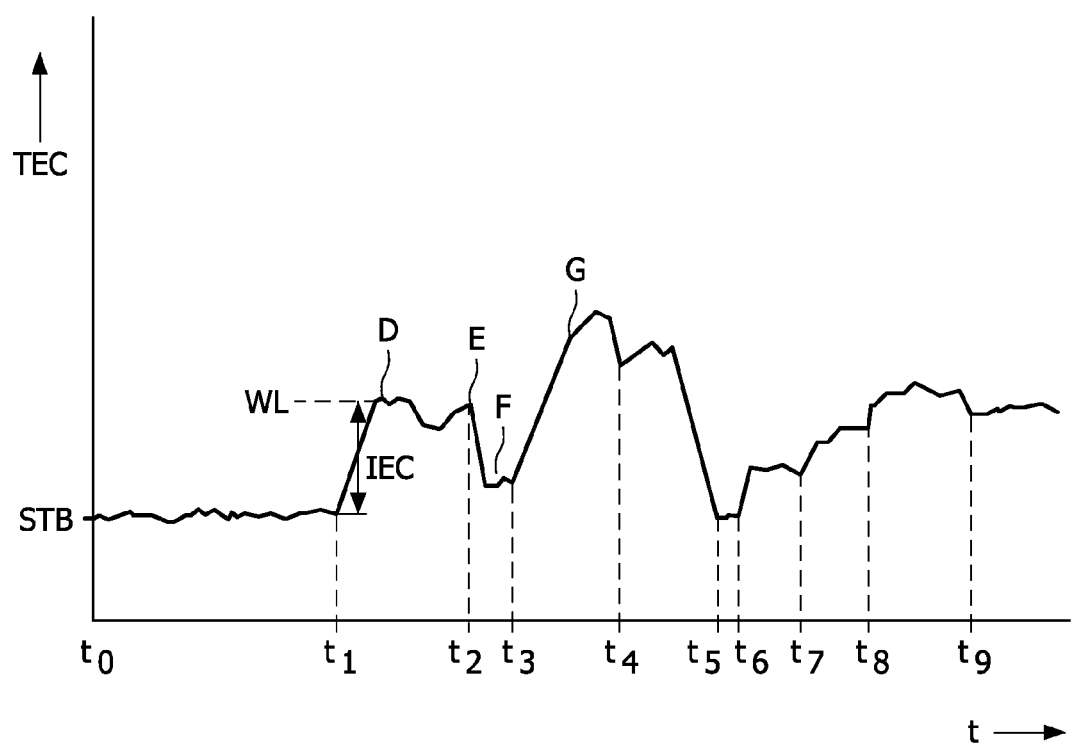

FIG. 2 schematically shows a graph indicating an example of the total power measured.

Between the instants t0 to t1, none of the devices DEi is switched on. With switched on is meant in an active status which is not the stand-by status or the off-status. The total power consumption TEC between the instants to and t1 is determined by the standby power consumption of all devices DEi which are in standby-mode. Nowadays many devices consume a stand-by power, for example, televisions, computer monitors, DVD and CD players, clocks, cookers, fridges, freezers, and coffee makers. At instant t1 a washing machine starts a washing cycle which comprises the sub-cycles D, E, F and G. Different power consumptions may occur during these different sub-cycles D, E, F and G. The sub-cycles D, E, F and G together last from the instants t1 to t4. Thus, the washing machine is switched off at the instant t4. Usually, these sub-cycles D, E, F and G are related to the well known different operating states of the washing machine. The washing machine may provide the operating status information OSi. The operating status information may only indicate when the washing machine is switched on or off. In a more sophisticated embodiment, the operating status information OSi may indicate the separate periods of time corresponding to the different sub-cycles D, E, F and G of the washing machine. The washing machine further provides its unique identifier IDi such that the controller CO knows of which device DEi the energy status is changed.

At or soon after the instant t1, the controller CO receives from the washing machine an operating status information OSi indicating that the washing machine is switched on. The controller CO receives the total power consumption TEC from the meter EM and thus is able to determine the power consumption IEC of the washing machine by subtracting the total power consumption STB before the instant t1 from the total power consumption WL some time delay after the instant t1. The time delay may depend on the actual washing machine used and on a speed of response of the meter. At the instant t3, while the washing machine is in sub-cycle F, a cooker grill is switched on. The controller CO is informed by the received operating status information OSi and the identifier IDi send by the cooker grill that the cooker grill is switched on. Again, the controller CO is able to determine the power consumed by the cooker grill by comparing the power measured by the meter EM some time delay after the instant t3 with the power measured by the meter EM before the instant t3.

At the instant t4 the washing machine is switched off. The controller CO may use this event to determine the power consumed at the end of the washing cycle. If the controller CO does not receive information on the occurrence of the sub-cycles the average power consumption of the washing machine may be approximated by averaging the determined power consumed by the washing machine after switch on (some time delay after the instant t1) and the determined power consumed before switch off (just before the instant t4).

At the instant t5 the cooker grill is switched off. A television set is switched on at the instant t6, a DAB radio is switched on at the instant t7, a DVD player is switched on at the instant t8, and the DAB radio is switched off at the instant t9.

In an embodiment, the controller CO may retrieve from an operating status information OSi from a device DEi the course of the power consumption of the device DEi to provide a prediction of the expected power consumed, costs involved or equivalent amount of $CO_2$ produced. This retrieved information may also be stored to detect whether a particular device DEi is malfunctioning in that it is consuming more power than expected. The user may be warned accordingly. Instead of retrieving the course of the power consumption from the device DEi, the controller CO may determine this course from sampling the total power consumption TEC measured by the meter EM. Alternatively, the operating status information OSi of a particular device DEi (for example a cooker grill) may comprise an indication of a power level setting of the device DEi. Again, the controller CO may use this extra information to predict the power consumption or costs, or may indicate a malfunction.

Figure 3:
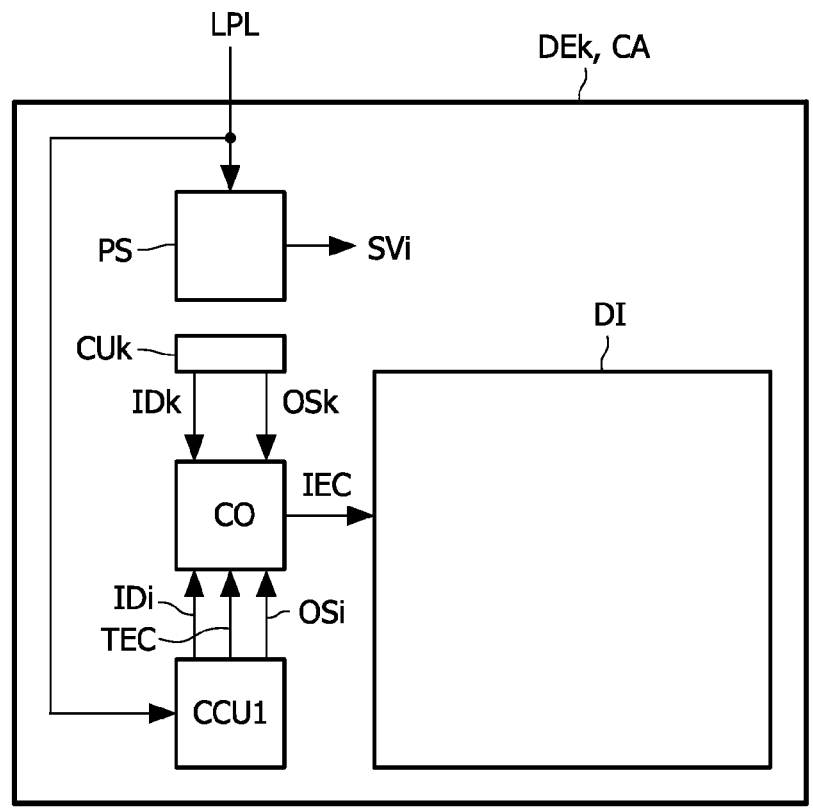

FIG. 3 schematically shows a consumer apparatus with a controller for determining the energy consumption of individual devices. The device DEk is a consumer apparatus CA which comprises a display DI, a power supply PS, the controller CO with its communication unit CCU1 and a controller circuit CON, and the communication unit CUk. The power supply PS is connected to the local power lines LPL to generate supply voltages SVi for use in the consumer apparatus CA. In the embodiment shown, the data TEC supplied by the energy meter EM is modulated on the local power line LPL, for example according to the X10 standard. The other devices DEi also modulate their operating status information OSi and their identifier IDi on the local power line. The communication unit CCU1 demodulates the information on the local power line LPL and supplies the total consumed power TEC measured, the operating status information OSi and the identifier IDi to the controller circuit CON. In line with FIG. 1, the communication unit CUk supplies the operating status information OSk and the identifier IDk of the consumer apparatus CA. However, in fact this communication unit CUk is superfluous because the operating status information OSk and the identifier IDk can be directly supplied to the controller CO or may even be stored in the controller CO. The identifier IDk is not at all required because it is known in which consumer apparatus CA the controller is implemented. The controller circuit CO supplies the information on the individual energy consumption IEC of the devices DEi to the display. For example, the actual amount of energy consumed per device DEi so far the present day, or over any other time period may be displayed. Instead of the amount of energy consumed, the cost may be displayed, or the equivalent amount of $CO_2$. For example, the actual price of the energy delivered may be obtained by the controller CO from the central unit ECU of the energy provider.

If the data from the meter EM and/or other devices DEi is not modulated on the local power line, separate data lines or wireless connections are required.

If the controller CO is a stand alone unit or is not integrated in a device which has a display DI, the controller CO should be able to relay its energy data to the device which has the display such that the data can be displayed. This is particularly relevant for consumer products when the energy data is electricity data indicating the power consumption of the consumer products.

Figure 4:
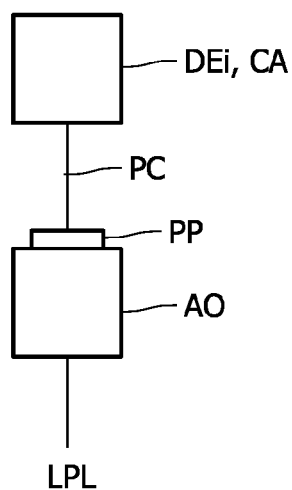

FIG. 4 schematically shows an add-on device with a controller for determining the electricity energy consumption of individual devices. The add-on device AO is arranged between the power plug PP of the power cord PC of the device DEi and the local power line LPL. Such an add-on device AO, which comprises the controller CO, can easily be added to an existing system.

FIG. 5 schematically shows a system in which the controller is mechanically integrated with the meter. In this embodiment, four devices DE1 to DE4 are present. For example the devices DE1, DE2, DE3 and DE4 may be a washing machine, a freezer, a television receiver and a set-top box, respectively. All devices DE1 to DE4 are connected to the local power line LPL. The current in the local power line LPL is drawn from the mains power MA via the electricity meter EM. The controller CO is mechanically integrated with the electricity meter EM. Each of the devices DE1 to DE4 may have a direct data link DL1, DL2, DL3 and DL4, respectively, to the controller CO. Alternatively, the data of all or some of the devices DEi may be linked through. For example, instead of, or in addition to, the data link DL3, the television receiver DE3 may provide the data via the data link DL3' to the set-top box DE4. The set-top box DE4 forwards the data received from the television receiver DE3 to the controller CO. The data may contain the identifier IDi and the operating status information OSi. The data links may be hard wired or wireless. Alternatively, the data links may be created over the local power line LPL. The controller CO operates in the same manner as discussed hereinbefore.

The system may include devices DEi that generate energy, for example, solar panels or windmills. These energy generating devices DEi might be part of a networked building. Their individual electricity contribution can also be individually metered using the same principles applied to electricity consuming devices DEi.

FIG. 6 schematically show an AC mains plug with current sensing circuitry. FIG. 6A shows a side view of an AC mains plug, and FIG. 6B shows a bottom view of this AC mains plug (further also referred to as plug). Such an AC mains plug with current sensing circuitry may be implemented if the operating status information OSi is either status change information only, or more complex information providing an actual power consumption or an average power consumption. The status change information may indicate that the power consumed changed from a first to a second particular state. Often it is not required for such a state change to know the exact power consumed in each one of the states. An approximation of the power consumed may be sufficient to conclude in which power consumption state the energy consuming apparatus actually is.

The plug of the embodiment shown in FIG. 6 is used in Great Britain. Such a plug has three pins, a ground pin PIG, a voltage carrying pin PIV carrying the mains voltage to supply energy and a return pin PIR acting as the return path for the current supplied by the voltage carrying pin PIV. The mechanical structure and the number of pins may be different in other countries of the world. For example, the ground pin PIG may be absent.

The current sensing circuitry is provided within a thin electrically insulating sheet SH which is slipped over the pins PI of the plug. At least the current sensing circuitry is present within the electrically insulating sheet SH. The sheet SH is shaped to be easily fitted over the pins of the plug by an unskilled person, and to not interfere with the ability of the plug to mate properly into its socket. In an embodiment, the thickness of the sheet SH is in the range from 1 to 2 mm. Circuitry capable of sensing current passing through at least one of the pins PIV or PIR is embedded in the sheet SH.

This circuitry may comprise an annular ring MR of material with a high magnetic permeability. The ring MR of magnetic permeable material surrounds one of the pins PIV or PIR. A coil CC is wound around the ring MR. A number of turns of conductor forming the coil CC can be selected at will to suit the further processing of the voltage generated by the coil CC. This voltage is monotonically dependent on the amount of current flowing through the associated pin PIV or PIR. From this voltage, the current operating status of the device, and optionally an indication of the power consumption of the device, may be determined by the sensing circuit SEC.

In an embodiment, the number of turns is selected to maximally fill in a single layer the ring MR to obtain a high voltage across the coil CC. Although not shown in FIG. 6, in an embodiment, the shape of the ring is such that the inner edge is as close as possible to the pin PIV or PIR, and such that it has as large an area as will fit in the available space, in order to maximize the induced voltage.

A single coil CC may be used around one of the pins PIV or PIR, alternatively, two coils CC may be implemented, one around the pin PIV to sense the current through this pin and one around the pin PIR to sense the return current. This has the advantage that the difference of the two voltages induced in the two coils CC can be used and thus the sensitivity is doubled. The two voltages have opposite polarity, thus to obtain the double sensitivity, the two induced voltages should be subtracted. The use of two coils CC has the further advantage that the effect of the stray magnetic fields sensed by the two current sensors is decreased or compensated because by taking the difference of the induced voltages, the common components caused by the stray magnetic fields are subtracted. The coils may be implemented from fine wire, for example 50 SWG, or may be multilayer printed.

A sensing circuit SEC may be present on the sheet SH to sense the voltage induced in the coil or the coils CC. As the induced voltages are typically small, the sensing circuit SEC should comprise an amplifier. To minimize the influence of disturbances, the sensing circuit SEC may be positioned close to the coil or coils CC to minimize the length of the connections between the coil or coils CC and the sensing circuit SEC. The sensing circuit SEC may comprise a wired or wireless communication circuit. The communication circuit may provide the induced voltage directly or in a coded form. The communication circuit may modulate the level of the induced voltage or the code on a carrier to facility optical or electromagnetic wireless transmission.

Alternatively, wired external connections ICO may be present to feed the induced voltages directly, the amplified induced voltage if a single coil CC is present, both the amplified voltages or the difference voltage if two coils CC are present, or coded information about the sensed current to outside of the plug. The connection ICO transports the signal(s) to circuitry which is mounted on the back side of the plug. Dependent on what circuitry is present on the sheet SH, the circuitry mounted on the back side of the plug may comprise the amplifier and/or the communication circuitry. It has to be noted that instead of the upgrade unit with a insulating sheet which can be slipped over the pins of the plug, the same functionality can be positioned in the plug. Such a special plug comprises the ring(s) MR of permeable material and the coil(s) CC, and may comprise the sensing circuit SEC, optionally fitted with a wireless communication unit.

It should be noted that the above-mentioned embodiments illustrate rather than limit the invention, and that those skilled in the art will be able to design many alternative embodiments without departing from the scope of the appended claims.

It has to be noted that the local power line LPL may contain two or three (including a ground line) lines in a two phase system.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A system for measuring energy consumption, the system comprising:
   a plurality of devices, each device comprises a communication unit for supplying operating status information indicating an actual operating status with respect to an actual energy consumption of the device;
   a meter for measuring a total energy consumption of the plurality of devices, and a controller for calculating an individual energy consumption of a first device selected from the plurality of devices from a change of the total energy consumption occurring at a change of the operating status of the first device.

2. The system as claimed in claim 1, wherein the communication unit supplies an identifier uniquely identifying the first device.

3. The system as claimed in claim 1, wherein the controller is mechanically integrated with the meter.

4. The system as claimed in claim 1, wherein at least one of the plurality of the devices comprises a consumer apparatus and the controller are mechanically integrated with the consumer apparatus.

5. The system as claimed in claim 4, wherein the consumer apparatus comprises a display for displaying information based on the individual energy consumption.

6. The system as claimed in claim 1, wherein at least one of the plurality of the devices comprises a consumer apparatus having a power plug and the controller is an add on to the power plug.

7. The system as claimed in claim 1, wherein the communication unit is constructed for wireless transmission of the operating status and the controller is constructed for wireless reception of the operating status.

8. The system as claimed in claim 7, wherein the communication unit wirelessly transmits the identifier, and the controller wirelessly receives the identifier.

9. The system as claimed in claim 1, wherein the communication unit transmits the operating status via the mains power lines which interconnect the plurality of devices and the controller, and the controller receives the operating status via the mains power lines.

10. The system as claimed in claim 1, wherein the controller comprises a communication unit for communicating with a central unit of an energy supplier.

11. The system as claimed in claim 1, wherein the energy is electrical energy supplied by an AC mains voltage, and wherein at least one of the plurality of devices includes an AC mains plug comprising:
   a voltage carrying pin for receiving the AC mains voltage,
   a return pin for providing a return path for a current drawn by the one of the plurality of devices via the voltage carrying pin,
   a current sensing circuitry comprising an annular ring of magnetic permeable material and surrounding the voltage carrying pin or the return pin, and
   a coil wound around the ring, to obtain the operating status information providing a status change information indicating a change of energy consumed, and/or an indication of the energy consumed after the status change and/or an actual power consumption or an average power consumption of the device.

12. The system as claimed in claim 1, wherein the controller further comprises a user interface for receiving user input and the controller performs a setup phase in which a user manually informs the controller about a change of the operating status of a device not having an unique identifier, and the controller determines the individual energy consumption of this device from the change of total energy consumption occurring in response to the change of the operating status.

13. The system as claimed in claim 1, further comprising an energy generating device and wherein the total energy consumption of the plurality of devices also includes energy generated by the energy generating device, and the controller of the plurality of devices also calculates the energy generated by the energy generating device from the change of the total energy consumption occurring at a change of an operating status of the energy generating device.

14. A method of measuring energy consumption in a system comprising a plurality of devices, each comprising a communication unit, the method comprising acts of:
   each device supplying operating status information indicating an actual operating status with respect to an actual energy consumption of the device;
   measuring a total energy consumption of the plurality of devices; and
   calculating an individual energy consumption of a first device selected from the plurality of devices from a change of the total energy consumption occurring at a change of the operating status of the first device.

* * * * *